United States Patent
Kim et al.

(10) Patent No.: US 7,599,278 B2
(45) Date of Patent: Oct. 6, 2009

(54) RECORDING MEDIUM COMPRISING FERROELECTRIC LAYER, NONVOLATILE MEMORY DEVICE COMPRISING RECORDING MEDIUM, AND METHODS OF WRITING AND READING DATA FOR THE MEMORY DEVICE

(75) Inventors: Yun-seok Kim, Namyangiu-si (KR);
Seung-bum Hong, Seongnam-si (KR);
Kwang-soo No, Daejeon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 709 days.

(21) Appl. No.: 10/925,147

(22) Filed: Aug. 25, 2004

(65) Prior Publication Data

US 2005/0147018 A1  Jul. 7, 2005

(30) Foreign Application Priority Data

Aug. 25, 2003  (KR) ............. 10-2003-0058790
Jan. 15, 2004  (KR) ............. 10-2004-0002925

(51) Int. Cl.
*G11B 9/00*  (2006.01)
(52) U.S. Cl. .............. 369/126; 369/100; 369/283; 369/286
(58) Field of Classification Search ............... None
See application file for complete search history.

(56) References Cited

U.S. PATENT DOCUMENTS

| | | | | |
|---|---|---|---|---|
| 5,777,977 A | * | 7/1998 | Fujiwara et al. | 369/126 |
| 5,985,404 A | * | 11/1999 | Yano et al. | 428/846.1 |
| 6,139,971 A | * | 10/2000 | Bruchhaus et al. | 428/446 |
| 6,636,435 B2 | * | 10/2003 | Yang et al. | 365/145 |
| 2003/0034548 A1 | * | 2/2003 | Hayashi et al. | 257/532 |
| 2003/0098347 A1 | * | 5/2003 | Hong et al. | 235/451 |
| 2005/0094430 A1 | * | 5/2005 | Nauka et al. | 365/151 |

FOREIGN PATENT DOCUMENTS

JP  6-68530  3/1994

\* cited by examiner

*Primary Examiner*—Wayne R Young
*Assistant Examiner*—Lixi Chow
(74) *Attorney, Agent, or Firm*—Sughrue Mion, PLLC

(57) ABSTRACT

A recording medium including a ferroelectric layer, a nonvolatile memory device including the recording medium and methods of wiring and reading data in the memory device. The recording medium includes: a lower electrode; a ferroelectric layer to which data is recorded, formed on the lower electrode; a barrier layer formed on the ferroelectric layer; and a semiconductor layer formed on the barrier layer. The nonvolatile memory device includes a probe that reads and writes the data. Furthermore, in the method of writing data, a writing voltage is applied between the probe, which contacts the semiconductor layer, and the lower electrode and, in the method of reading data, a state of a remanent polarization of the ferroelectric layer is determined by applying a reading voltage between the probe and the semiconductor layer.

5 Claims, 7 Drawing Sheets

RECORDING MEDIUM COMPRISING FERROELECTRIC LAYER, NONVOLATILE MEMORY DEVICE COMPRISING RECORDING MEDIUM, AND METHODS OF WRITING AND READING DATA FOR THE MEMORY DEVICE

BACKGROUND OF THE INVENTION

This application claims the priority of Korean Patent Application Nos. 2003-58790, filed on Aug. 25, 2003, and 2004-2925, filed on Jan. 15, 2004, in the Korean Intellectual Property Office, the disclosure of which is incorporated herein in its entirety by reference.

1. Field of the Invention

The present invention relates to a recording medium, a memory device including the recording medium, and methods of writing and reading data for the memory device, and more particularly, to a recording medium including a ferroelectric layer, a nonvolatile memory device including the recording medium, and methods of writing and reading data for the nonvolatile memory device.

2. Description of the Related Art

As the demand for small and thin electronic devices such as mobile telecommunication devices and electronic notes increases, the necessity of ultra-small and integrated memory devices also increases. However, there are limitations in minimizing the size of a hard disk which is a conventional data storage device. A flash memory could be used as an alternative to the hard disc, however, it is very difficult to enhance integration degree of the flash memory. Therefore, a new, ultra-small, highly-integrated, nonvolatile memory device is required. For this purpose, a memory device using a scanning probe (hereinafter probe) has been developed.

For an ultra-small and integrated memory device that uses the probe when reading data, a ferroelectric layer, a ferromagnetic layer, a thermoplastic resin, and a thermosetting resin have been developed as alternative recording media.

Data recorded in the alternative recording media can be read by applying a sensing force to the probe such as an electrostatic force, a static magnetism force, piezoelectric force, etc., and sensing changes in electrical characteristics of the recording medium, for example, differences in electrical and thermal conductivity.

A memory device that senses a polarized state of a domain of the ferroelectric layer using piezoelectric force utilizes a lock-in amplifier, and thus, it is difficult to sufficiently reduce the size of the memory device.

Data can be written in the recording medium by inverting the domain of the ferroelectric layer or the ferromagnetic layer with the probe, or by heating the recording medium to produce a phase transition or damage an area where data will be recorded. The latter method, that is, the heating method, proceeds very slowly and is disadvantageous when the reading and writing processes are repeated.

Ultra-small and integrated memory devices have been developed by combining the aforementioned methods. These memory devices are categorized into two types depending on whether the probe contacts the recording medium.

If the probe does not contact the recording medium, while data is read, an extra feed back circuit is required to maintain a constant distance between the probe and the recording medium. Thus, it is difficult to minimize the size of the memory device for mobile products.

On the other hand, if the probe contacts the recording medium, while data is read, abrasion of the probe and the recording medium, especially that of the recording medium, may be a serious problem. In addition, data reading speed can be limited due to the resonance frequency of a cantilever (normally 1 MHz or less) which supports the probe.

SUMMARY OF THE INVENTION

The present invention provides a recording medium which is suitable for minimizing the size of a memory device, incurs little abrasion and has an enhanced reading speed.

In addition, the present invention provides a non-volatile memory device including the recording medium and methods of writing and reading data in the memory device.

According to an aspect of the present invention, a recording medium of a nonvolatile memory device is provided, the recording medium comprising: a lower electrode; a ferroelectric layer, to which data is recorded, formed on the lower electrode; a barrier layer formed on the ferroelectric layer; and a semiconductor layer formed on the barrier layer.

The ferroelectric layer is formed of a PZT (lead zirconate titanate) layer, a STO ($SrTiO_3$) layer, a BTO ($BaTiO_3$) layer, or a PTO ($PbTiO_3$) layer. The barrier layer is formed of a yttrium oxide ($Y_2O_3$) layer or an aluminum oxide ($Al_2O_3$) layer. The semiconductor layer forms a Schottkey junction with a metallic material of the probe.

According to another aspect of the present invention, a nonvolatile memory device is provided, including a recording medium and a probe that writes data to the recording medium and reads data from the recording medium, the nonvolatile memory device comprising: a lower electrode; a ferroelectric layer, to which the data is written, formed on the lower electrode; a barrier layer formed on the ferroelectric layer; and a semiconductor layer formed on the barrier layer with the probe.

In this case, the ferroelectric layer, the barrier layer, and the semiconductor layer are the same as above.

The probe may be composed of a metallic material that forms a Schottkey junction together with the semiconductor layer.

According to yet another aspect of the present invention, a method of writing data in a nonvolatile memory device is provided, including a recording medium that includes a lower electrode, a ferroelectric layer, to which data is written, formed on the lower electrode, a barrier layer formed on the ferroelectric layer, a semiconductor layer formed on the barrier layer; and a probe that writes data to the recording medium or reads data from the recording medium, the method comprising: applying a writing voltage between the lower electrode and the probe by contacting a surface of the semiconductor layer.

In this case, the ferroelectric layer, the barrier layer, the semiconductor layer and the probe are the same as above.

According to yet another aspect of the present invention, a method of reading data from a nonvolatile memory device is provided, comprising a recording medium that comprises a lower electrode, a ferroelectric layer to which the data is written, formed on the lower electrode, a barrier layer formed on the ferroelectric layer, and a semiconductor layer formed on the barrier layer; and a probe which writes the data to the recording medium or reads the data from the recording medium, the method comprising: a first operation of applying a reading voltage between the probe and the semiconductor layer by contacting a surface of the semiconductor layer with the probe; and a second operation of measuring a state of remanent polarization in the ferroelectric layer by measuring, with the probe, electrical characteristics such as current or resistance between the probe and the semiconductor layer.

In this case, the ferroelectric layer, the barrier layer, and the semiconductor layer are the same as above.

The first operation may include applying a first read voltage and then a second read voltage between the probe and the semiconductor layer, the first and second read voltages being different from each other.

The second operation may involve measuring a first current or a first resistance between the probe and the semiconductor layer based on the first read voltage; measuring a second current or a first resistance between the probe and the semiconductor layer based on the second read voltage; and determining a state of remanent polarization of the ferroelectric layer by obtaining a difference between the first and second currents or between the first and second resistances.

There is little or no abrasion of the ferroelectric layer because the probe does not directly contact the ferroelectric layer. Moreover, the method of reading data of the present invention can enhance reading speed since the reading process is simple, and thus, a highly enhanced storage capability is maintained. In addition, an extra device to write and read data is not required, thereby minimizing the size of the memory device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
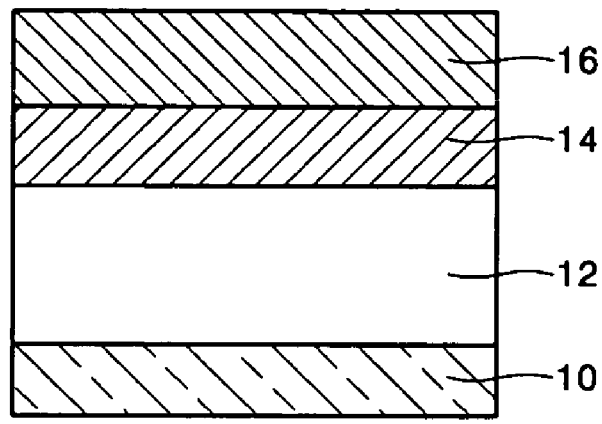
FIG. 1 is a cross-sectional view of a recording medium according to a first embodiment of the present invention.

The present invention will now be described more fully with reference to the attached drawings, in which exemplary embodiments of the invention are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the forms of elements are exaggerated for clarity. To facilitate understanding, identical reference numerals have been used for like elements throughout the figures.

FIG. 1 is a cross-sectional view of a recording medium according to a first embodiment of the present invention.

Referring to FIG. 1, the recording medium according to a first embodiment of the present invention includes a lower electrode 10 to which a predetermined voltage is applied when data is written, a ferroelectric layer 12, in which the data is written, a first semiconductor layer 16 to which the predetermined voltage is applied when the data that is written in the ferroelectric layer 12 is read, and a barrier layer 14 disposed between the ferroelectric layer 12 and the first semiconductor layer 16. The barrier layer 14 prevents reactions between the first semiconductor layer 16 and the ferroelectric layer 12 during fabrication and also serves as a gate oxide layer. Preferably, but not necessarily, the ferroelectric layer 12 is composed of a material having strong vertical polarization characteristics. In addition, the ferroelectric layer 12 may be a first ferroelectric layer which has a first polarization magnitude when a voltage is applied thereto or a second ferroelectric layer which has a second polarization magnitude when a voltage is applied thereto. Here, the second polarization magnitude is larger than the first polarization magnitude. The current-voltage characteristics of the first semiconductor layer 16 on the ferroelectric layer 12 varies depending on the polarization magnitude of the ferroelectric layer, which will be described in greater detail below.

The first and second ferroelectric layers may be composed of the same material or different materials. In a case where the first and second ferroelectric layers are formed of the same material, they are formed to have different thicknesses so as to have different polarization magnitudes. However, even when the first and second ferroelectric layers are to have the same thickness, it is still possible to cause the first and second ferroelectric layers to exhibit different polarization magnitudes by applying different manufacturing conditions.

Figure 3:
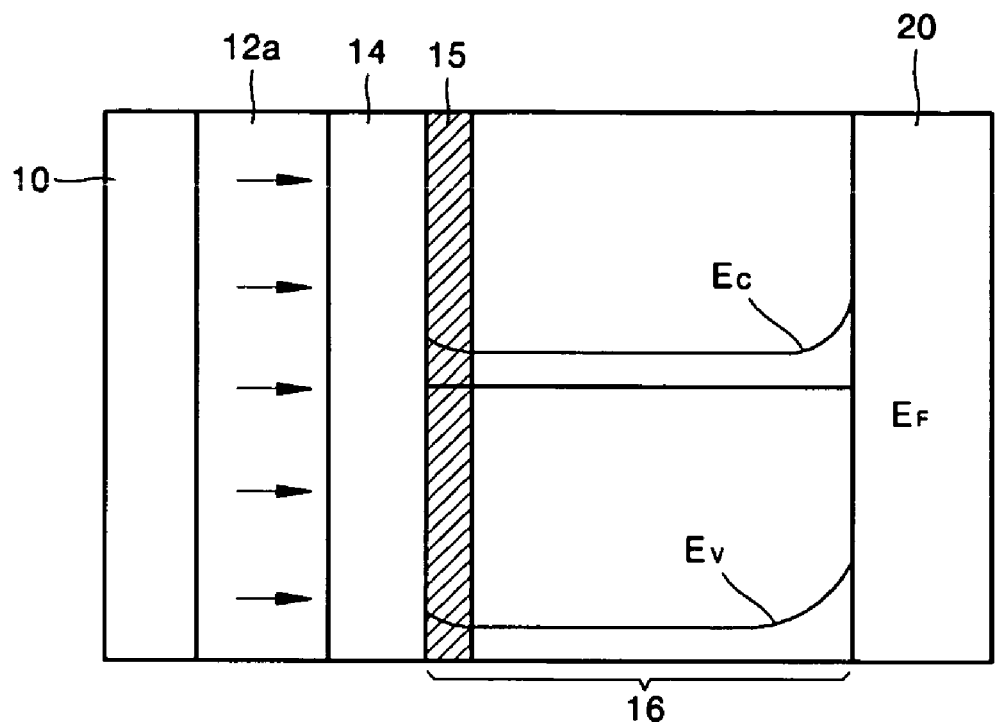
FIG. 3 is a diagram illustrating an energy band of a semiconductor layer disposed between a barrier layer and a probe in a case where a ferroelectric layer of the recording medium of FIG. 1 has a small polarization magnitude and is polarized toward a lower electrode.
Figure 5:
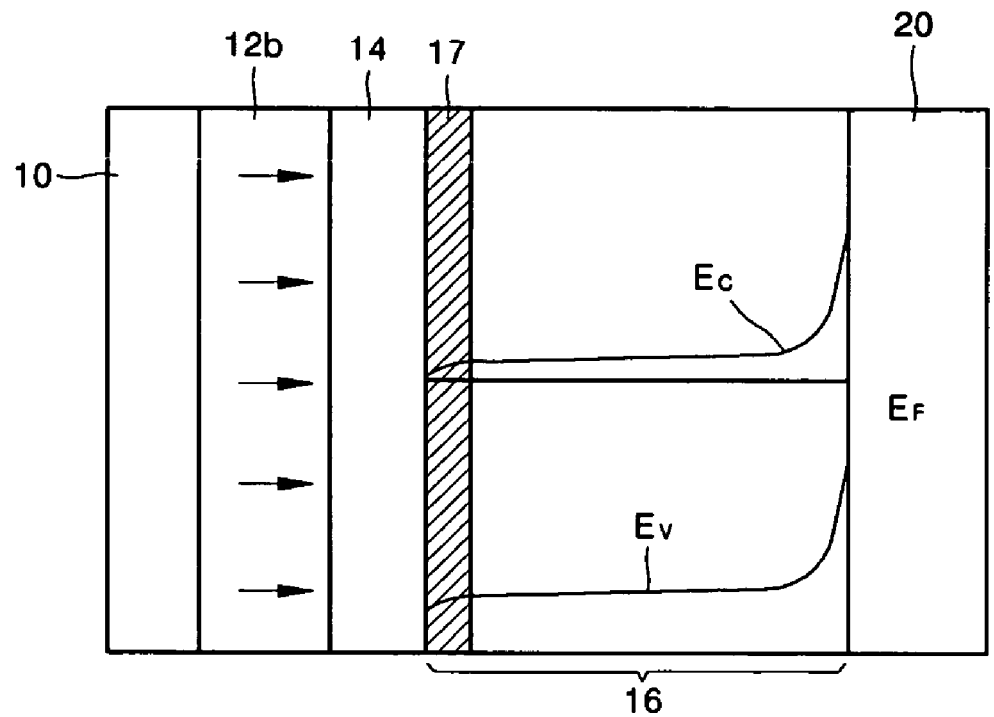
FIG. 5 is a diagram illustrating an energy band of the semiconductor layer in a case where the ferroelectric layer of the recording medium of FIG. 1 has a large polarization magnitude and is polarized toward the lower electrode.

For example, if the first and second ferroelectric layers are PZT layers of the same thickness, the first ferroelectric layer may be formed under a condition in which the component ratio of Zr to Ti is large and the second ferroelectric layer may be formed under a condition in which the component ratio of Zr to Ti is small. As a result, the polarization magnitude of the first and second ferroelectric layers becomes different. When the first ferroelectric layer is a PZT layer, a depletion layer 15 is formed by the polarization magnitude of the first ferroelectric layer, as shown in FIG. 3. Also, when the second ferroelectric layer is a PZT layer, an accumulation layer 17 is formed by the polarization magnitude of the second ferroelectric layer, as shown in FIG. 5.

Figure 14:
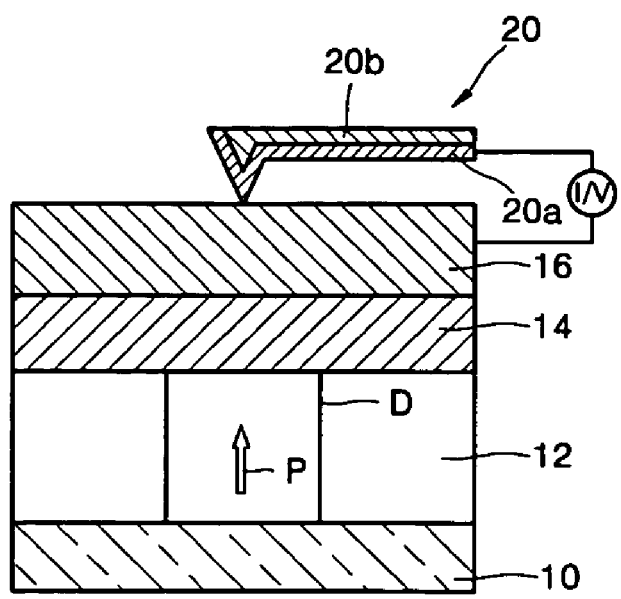
FIG. 14 is a cross-sectional view illustrating a process of reading data from a recording medium, on which data is recorded in the same manner as shown in FIG. 2.

The ferroelectric layer 12 is preferably a PZT (Pb(Zr,Ti)$O_3$) layer, but other types of ferroelectric layers such as a STO (SrTiO$_3$) layer, a BTO (BaTiO$_3$) layer, and a PTO (PbTiO$_3$) layer may also be used. The ferroelectric layer 12 may be formed to be thin or thick, or in a bulk state. The barrier layer 14 may be a yttrium oxide layer ($Y_2O_3$) or an aluminium oxide layer ($Al_2O_3$) with a thickness of 100 nm or less. However, the barrier layer 14 can be any material that prevents reactions between the first semiconductor layer 16 and the ferroelectric layer 12 and does not influence the polarization characteristics of the ferroelectric layer 12 and the resistance or current characteristics of the first semiconductor layer 16 depending on the polarization characteristics of the ferroelectric layer 12. The first semiconductor layer 16, which acts used as an upper electrode, is preferably an n-type silicon layer, however any semiconductor layer that makes a Schottkey junction with a probe can be used. The probe 20 contacts a surface of the first semiconductor layer 16 when writing and reading data as shown in FIGS. 2 and 14.

A method of writing data in the recording medium shown in FIG. 1 will now be described.

Figure 2:
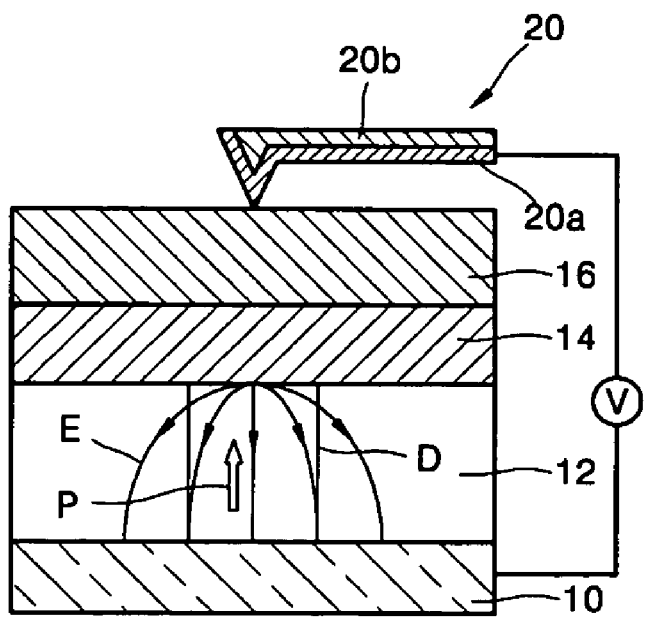
FIG. 2 is a cross-sectional view illustrating a process of writing data according to a second embodiment of the present invention in the recording medium of FIG. 1.

Referring to FIG. 2, the probe 20 contacts the first semiconductor layer 16 and writes data in the recording medium according to a second embodiment of the present invention. The probe 20 includes a first portion 20a that contacts the surface of the first semiconductor layer 16 and a second portion 20b that supports the first portion 20a. The first portion 20a is preferably formed of Pt, but any metal that forms a Schottkey junction with the first semiconductor layer 16 can be used. For example, the first portion 20a may be formed of Au and the second portion 20b may be formed of a silicon (Si) layer or a silicon nitride layer ($Si_3N_4$).

The method of writing data in the recording medium using the probe 20 will now be described in detail.

First, a voltage is applied between the probe 20 and the lower electrode 10, while the probe 20 contacts the surface of the first semiconductor layer 16. An electric field E appears between the probe 20 and the lower electrode 10. The probe 20 contacts the first semiconductor layer 16 at a point. Thus, the electric field E is concentrated in a lower portion of the probe 20. A domain D is formed by the electric field E in a predetermined area of the ferroelectric layer 12. The direction P of the remanent polarization may be changed according to the voltage applied between the probe 20 and the lower electrode 10. The data written in the ferroelectric layer 12 depends on the direction P of the remanent polarization. For example, as shown in FIG. 2, when the direction P of the remanent polarization is toward the probe 20, data 1 is considered to be written in the ferroelectric layer 12 and when the direction P of the remanent polarization is toward the lower electrode 10, data 0 is considered to be written in the ferroelectric layer 12 or vice versa.

On the other hand, in the method of writing data as shown in FIG. 2, an energy band of the second semiconductor layer 16, which contacts the probe 20, varies depending on whether the ferroelectric layer 12 is the first or second ferroelectric layer, i.e., depending on the polarization magnitude of the ferroelectric layer 12. The energy band of the second semiconductor layer 16 also varies depending on the polarization direction of the ferroelectric layer 12.

Accordingly, when reading data from the recording medium of FIG. 1, the current-voltage characteristics of the first semiconductor layer 16 vary depending on the polarization magnitude and polarization direction of the ferroelectric layer 12.

Figure 4:
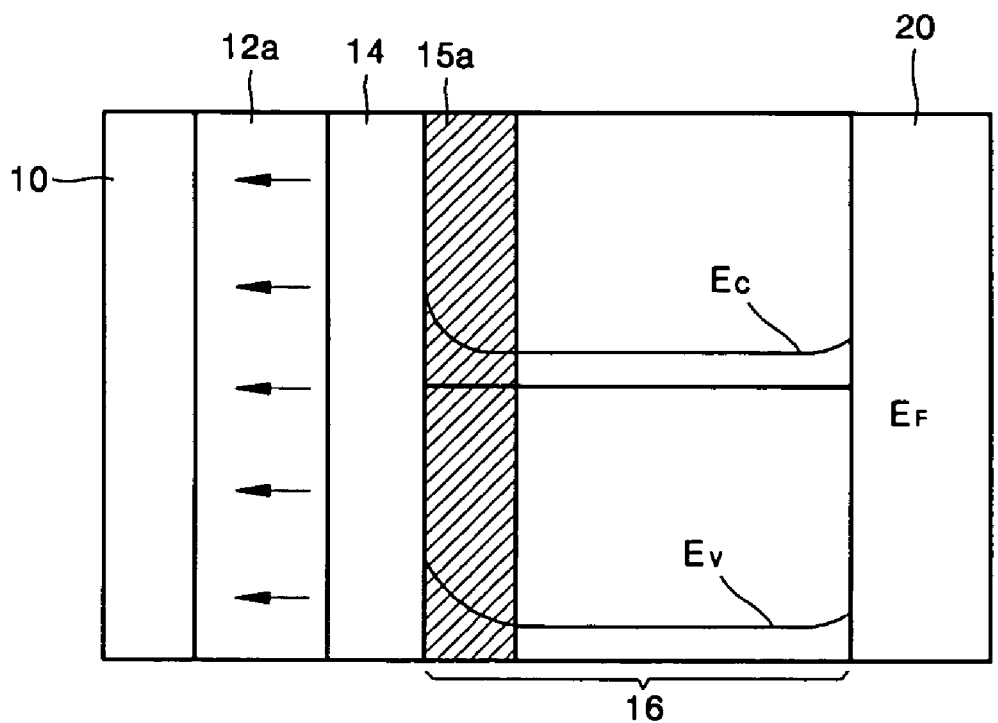
FIG. 4 is a diagram illustrating an energy band of the semiconductor layer where the ferroelectric layer of the recording medium of FIG. 1 has a large polarization magnitude and is polarized toward a barrier layer.

More specifically, in a case where a first ferroelectric layer 12a having a first polarization magnitude is disposed between the lower electrode 10 and the barrier layer 14, as shown in FIGS. 3 and 4, the width of a depletion layer 15 formed in the first semiconductor layer 16 varies depending on the polarization direction of the first ferroelectric layer 12a.

Referring to FIGS. 3 and 4, the width of a depletion layer 15a of FIG. 4, which is obtained when the first ferroelectric layer 12a is polarized toward the lower electrode 10, is larger than the width of the depletion layer 15 of FIG. 3, which is obtained when the first ferroelectric layer 12a is polarized toward the barrier layer 14. This means that the resistance of the first semiconductor layer 16 increases when the first ferroelectric layer 12a is polarized toward the lower electrode 10. This result can also be seen from the variation of an energy level $E_C$ of a conduction band of the first semiconductor layer 16. Comparing the energy level Ec of FIG. 3 with the energy level Ec of FIG. 4, the energy level $E_C$ of the conduction band of the first semiconductor layer 16 is higher when the first ferroelectric layer 12a is polarized toward the lower electrode 10, as shown in FIG. 4, than when the first ferroelectric layer 12a is polarized toward the barrier layer 14, as shown in FIG. 3.

In FIGS. 3 and 4, $E_F$ and $E_V$ respectively denote a Fermi level and an energy level of a valence band of the first semiconductor layer 16.

Figure 6:
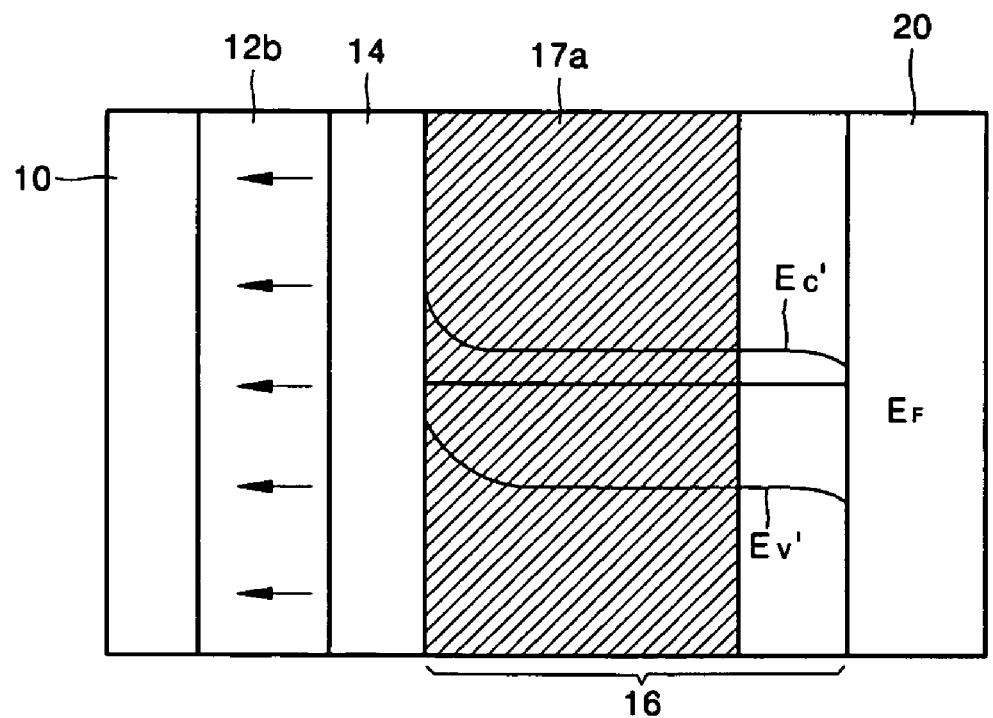
FIG. 6 is a diagram illustrating an energy band of the semiconductor layer where the ferroelectric layer of the recording medium of FIG. 1 has a large polarization magnitude and is polarized toward the barrier layer.

Referring to FIGS. 5 and 6, the recording medium comprises a second ferroelectric layer 12b, which is disposed between the lower electrode 10 and the barrier layer 14 and has a second polarization magnitude. As shown in FIGS. 5 and 6, the characteristics of the first semiconductor layer 16 vary depending on the polarization direction of the second ferroelectric layer 12b.

More specifically, as shown in FIG. 5, when the second ferroelectric layer 12b is polarized toward the barrier layer 14, an accumulation layer 17 is formed in the first semiconductor layer 16 due to a large polarization magnitude of the second ferroelectric layer 12b. The variation of the energy level $E_C$ of the conduction band of the first semiconductor layer 16 shows that due to the existence of the accumulation layer 17 in the first semiconductor layer 16, the resistance of the first semiconductor layer 16 decreases, but a potential barrier between the first semiconductor layer 16 and the probe 20 becomes higher.

Figure 7:
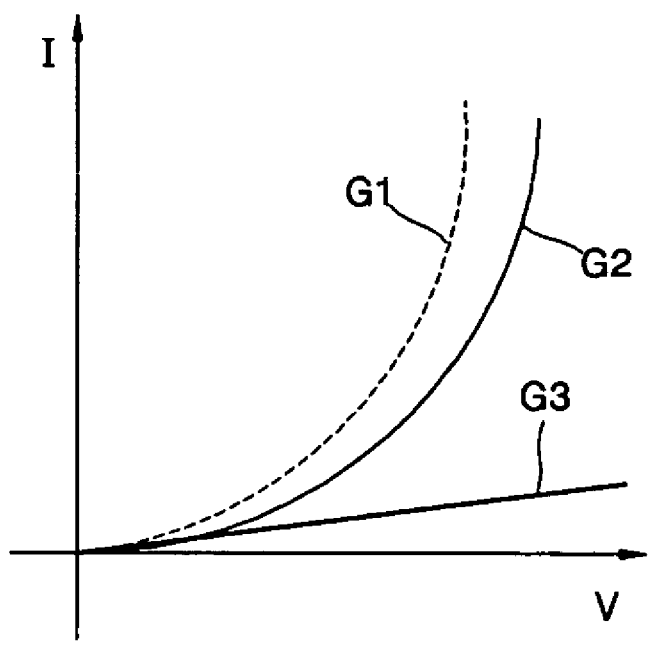
FIG. 7 is a graph illustrating various current-voltage characteristics between the semiconductor layer and the probe depending on the polarization direction of a ferroelectric layer of the recording medium of FIG. 1 where the ferroelectric layer is composed of a material having a large polarization magnitude.

Accordingly, when data is read from the recording medium having the second ferroelectric layer 12b polarized toward the barrier layer 14, the current-voltage characteristics of the recording medium, i.e., the current-voltage characteristics between the first semiconductor layer 16 and the probe 20, vary from a first curve G1 of FIG. 7 to a second curve G2 of FIG. 7.

On the other hand, as shown in FIG. 6, when the second ferroelectric layer 12b is polarized toward the lower electrode 10, a depletion layer 17a, which is very wide, is formed in the first semiconductor layer 16 due to the large polarization magnitude of the second ferroelectric layer 12b. Referring to an energy level $E_C$, of the conduction band of the first semiconductor layer 16, the resistance of the first semiconductor layer 16 becomes higher when the second ferroelectric layer 12b is polarized toward the lower electrode 10 than when the second ferroelectric layer 12b is polarized toward the barrier layer 14. Conversely, the potential barrier between the first semiconductor layer 16 and the probe 20 becomes lower when the second ferroelectric layer 12b is polarized toward the lower electrode 10 than when the second ferroelectric layer 12b is polarized toward the barrier layer 14.

Accordingly, when data is read from the recording medium having the second ferroelectric layer 12b polarized toward the lower electrode 10, the current-voltage characteristics of the recording medium varies from the second curve G2 of FIG. 7 to a third curve G3 of FIG. 7.

Referring to second and third curves G2 and G3 of FIG. 7, when the second ferroelectric layer 12b is polarized toward the lower electrode 10, current flowing between the first semiconductor layer 16 and the probe 20 (or between the first semiconductor layer 16 and a metallic layer, which can form a Schottkey junction together with the first semiconductor layer 16) increases in proportion to voltage. On the other hand, when the second ferroelectric layer 12b is polarized toward the barrier layer 14, the current flowing between the first semiconductor layer 16 and the probe 20 increases exponentially with the applied voltage. These two phenomena indicate a variation in the resistance of the first semiconductor layer 16 and a variation in the potential barrier between the first semiconductor layer 16 and the probe 20.

As described above, the current-voltage characteristics of the first semiconductor layer 16 contacting the probe 20, i.e., the resistance characteristics of the first semiconductor layer 16, vary depending on the polarization magnitude and polarization direction of the ferroelectric layer 12 of the recording medium of FIG. 1. Therefore, it is possible to read data from the recording medium of FIG. 1 by taking advantage of the variation in current-voltage characteristics of the first semiconductor layer 16 depending on the polarization magnitude and polarization direction of the ferroelectric layer 12.

A process of reading data from the recording medium of FIG. 1 is the same as a process of measuring the current-voltage characteristics (i.e., the resistance characteristics) between the first semiconductor layer 16 and the probe 20.

In accordance with the present invention, an equivalent (hereinafter, referred to as equivalent recording medium) of the recording medium of FIG. 1 was manufactured to measure the current-voltage characteristics (i.e., the resistance characteristics) between the first semiconductor layer 16 and the probe 20, and then the current-voltage characteristics of the equivalent recording medium were measured. The equivalent recording medium is illustrated in FIG. 8.

Figure 8:
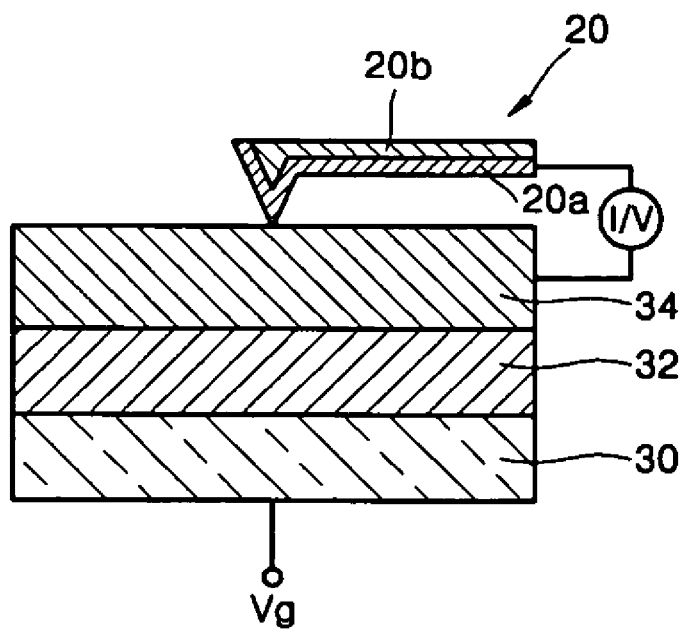
FIG. 8 is a cross-sectional view illustrating a process of reading data according to a third embodiment of the present invention from a recording medium that is equivalent to the recording medium having the written data of FIG. 2.

Referring to FIG. 8, the equivalent recording medium includes a semiconductor substrate 30, to which a gate voltage (Vg) is applied. The equivalent recording medium also includes an insulating layer 32 on the semiconductor substrate 30 and a second semiconductor layer 34 on the insulating layer 32.

The semiconductor substrate 30 is a silicon substrate doped with conductive impurities and the insulating layer 32 is a silicon oxide layer ($SiO_2$). An n-type silicon layer is utilized for the second semiconductor layer 34.

In a case where data is recorded on the equivalent recording medium in the same manner as shown in FIG. 2, remanent polarization exists in the domain D of the ferroelectric layer 12 of the equivalent recording medium. Thus, charge accumulates at a contact surface (hereinafter the contact surface) between the first semiconductor layer 16 and the barrier layer 14 due to the remanent polarization. For example, when the direction P of the remanent polarization is directed toward the probe 20, a negative charge is induced at the contact surface, in the first semiconductor layer 16. When the remanent polarization is directed toward the lower electrode 10, a positive charge is induced at the contact surface, in the first semiconductor layer 16.

In order to place the equivalent recording medium in the same state as a first recording medium comprising the first ferroelectric layer 12a having a first polarization magnitude or a second recording medium comprising the second ferroelectric layer 12b having a second polarization magnitude, a gate voltage Vg is applied to the semiconductor substrate 30.

It is assumed here that the equivalent recording medium is manufactured to be the same as the first recording medium. When a positive gate voltage Vg, for example +2V, is applied to the semiconductor substrate 30 (hereinafter a first case), a negative charge is induced at a contact surface of the second semiconductor layer 34 to which the insulating layer 32 is contacted. Therefore, the state of the second semiconductor layer 34 in the first case is the same as the state of the first semiconductor layer 16 when the remanent polarization is directed toward the probe 20 in the domain D of the ferroelectric layer 12. Accordingly, in the first case, the energy level of the second semiconductor layer 34 varies in the same pattern as the energy level $E_C$ or $E_V$ of the first semiconductor layer 16 of FIG. 3.

Furthermore, when a negative gate voltage Vg, for example −2V, is applied to the semiconductor substrate 30 (hereinafter a second case), a positive charge is induced at the contact surface of the second semiconductor layer 34 to which the insulating layer 32 is contacted. Therefore, the state of the second semiconductor layer 34 in the second case is the same as that of the first semiconductor layer 16 when the remanent polarization is directed toward the lower electrode 10 in the domain D of the ferroelectric layer 12. Accordingly, in the second case, the energy level of the second semiconductor layer 34 varies in the same pattern as the energy level $E_C$ or $E_V$ of the first semiconductor layer 16 of FIG. 4.

In the first and second cases, the probe 20 contacts the surface of the second semiconductor layer 34 and measures current that flows through the second semiconductor layer 34 and a predetermined voltage V is applied between the second semiconductor layer 34 and the probe 20.

Figure 9:
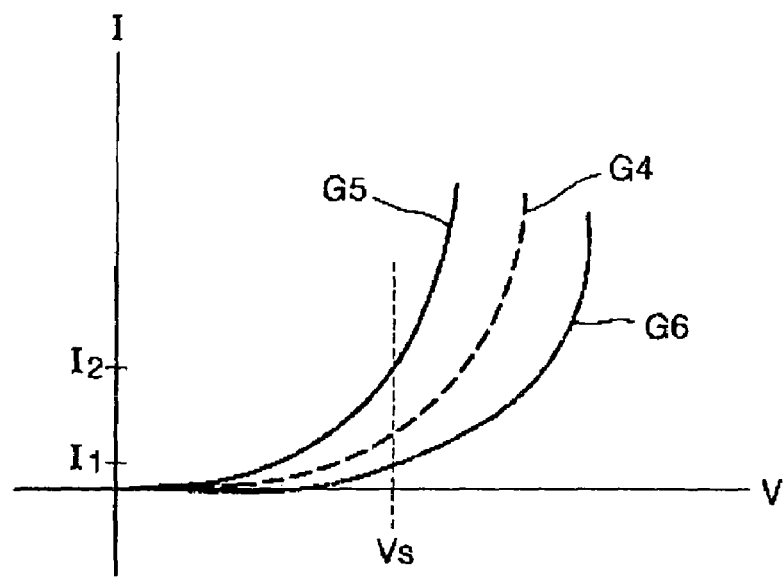
FIG. 9 is a graph illustrating various current-voltage characteristics between the semiconductor layer and the probe depending on the polarization direction of the ferroelectric layer of the recording medium of FIG. 1 where the ferroelectric layer is composed of a material having a large polarization magnitude.

FIG. 9 is a graph illustrating various current-voltage characteristics of the equivalent recording medium in a case where the equivalent recording medium is identical to the first recording medium. Referring to FIG. 9, G5 is a fifth curve illustrating the measured current-voltage characteristics of the second semiconductor layer of the equivalent recording medium in the first case, G6 is a sixth curve illustrating the measured current-voltage characteristics of the second semiconductor layer of the equivalent recording medium in the second case, and G4 is a fourth curve, which is a reference graph obtained when no gate voltage is applied to the semiconductor substrate 30.

Referring to G5 and G6 of FIG. 9, in both of the first and second cases, the higher the voltage V that is applied to the second semiconductor layer 34, the greater the current flow between the probe 20 and the second semiconductor layer 34.

However, the current increases by different amounts in the first and second cases. That is, when a sensing voltage Vs is applied to the probe 20 and the second semiconductor layer 34, a second current I2 flows through the second semiconductor layer 34 in the first case, but a first current I1, which is much less than the second current I2, flows through the second semiconductor layer 34 in the second case.

Since the recording medium of FIG. 3 is equivalent to the first case, and the recording medium of FIG. 4 is equivalent to the second case, the area of a depletion layer formed in the second semiconductor layer 34 in the second case is expected to be much larger than the area of a depletion layer formed in the second semiconductor layer 34 in the first case. Accordingly, the second current I2 is much larger than the first current I1.

Since the difference in the values of the first and second currents I1 and I2 is large, it is easy to determine whether the current is measured in the first or second case.

That is, instead of applying the gate voltage Vg to the semiconductor substrate 30, if the ferroelectric layer 12 is formed under the second semiconductor layer 34, the direction P of the remanent polarization of the ferroelectric layer 12 (data value written in the ferroelectric layer 12) can be identified by measuring the current flowing at the second semiconductor layer 34.

Moreover, since there is a large difference between the current flowing through the second semiconductor layer 34 in the first and second cases, the difference between the resistance in the second semiconductor layer 34 in the first and second cases is also large. Therefore, when measuring the resistance of the second semiconductor layer 34 at the sensing voltage Vs, it is easy to determine when the resistance is measured in the first or second case.

The recording medium of FIG. 2 and the equivalent recording medium of FIG. 8 are equivalent. Therefore, the above results measured in the second semiconductor layer 34 can be applied to the first semiconductor layer 16 of the recording medium of FIG. 2.

Figure 10:
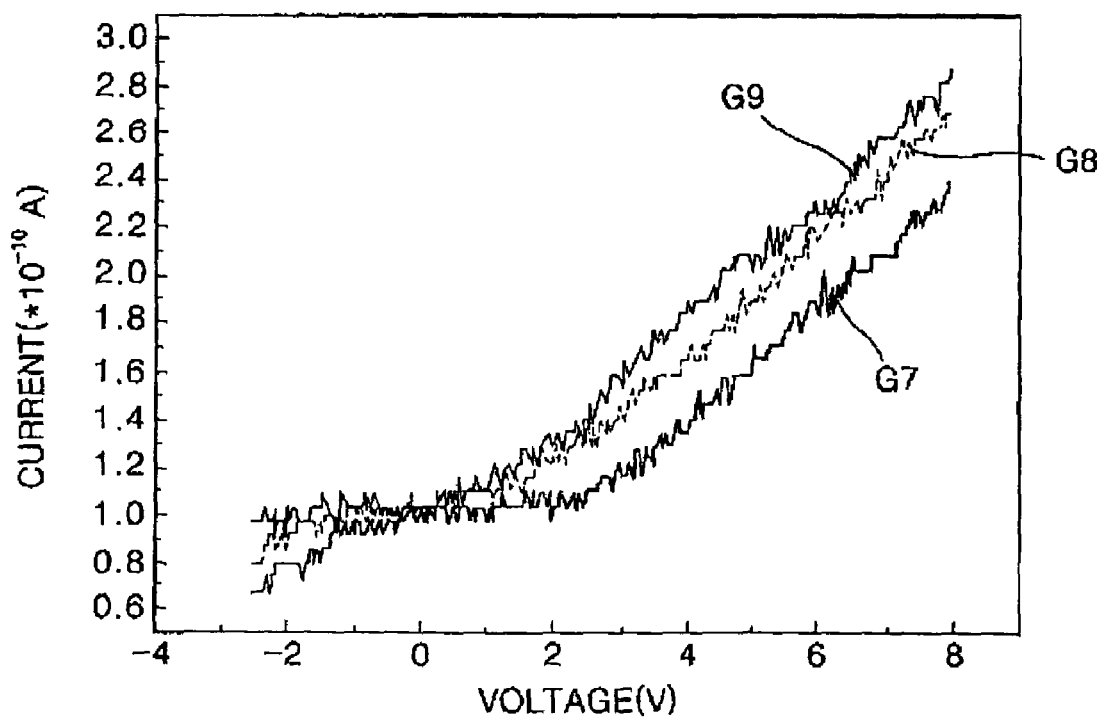
FIG. 10 is a graph illustrating results of measuring variations of current-voltage characteristics between a second semiconductor layer and a platinum probe depending on the gate voltage (Vg) in a case where an equivalent to the recording medium of FIG. 8 comprises a ferroelectric layer having a small polarization magnitude.

FIG. 10 is an experimental example of FIG. 9, and illustrates the current flowing through the second semiconductor layer 34 when the voltage V applied to the second semiconductor layer 34 is increased, and when the gate voltage Vg applied to the semiconductor substrate 30 of the equivalent recording medium is +2V, 0V and −2V, respectively.

Referring to FIG. 10, G7 is a seventh curve illustrating the current flowing through the second semiconductor layer 34 when the gate voltage Vg is fixed at −2V, G8 is an eighth curve illustrating the current flowing through the second semiconductor layer 34 when the gate voltage Vg is fixed at 0V, and G9 is a ninth curve illustrating the current flowing through the second semiconductor layer 34 when the gate voltage Vg is fixed at +2V.

Referring to the seventh through ninth curves G7 through G9, as the voltage V applied to the second semiconductor layer 34 is increased, the current in each of the seventh through ninth curves G7 through G9 increases. That is, the current through the second semiconductor layer 34 also increases. However, when the voltage V applied to the second semiconductor layer 34 exceeds +2V, the gap between the seventh and ninth curves G7 and G9 widens. This is the same result as seen in FIG. 9.

Figure 11:
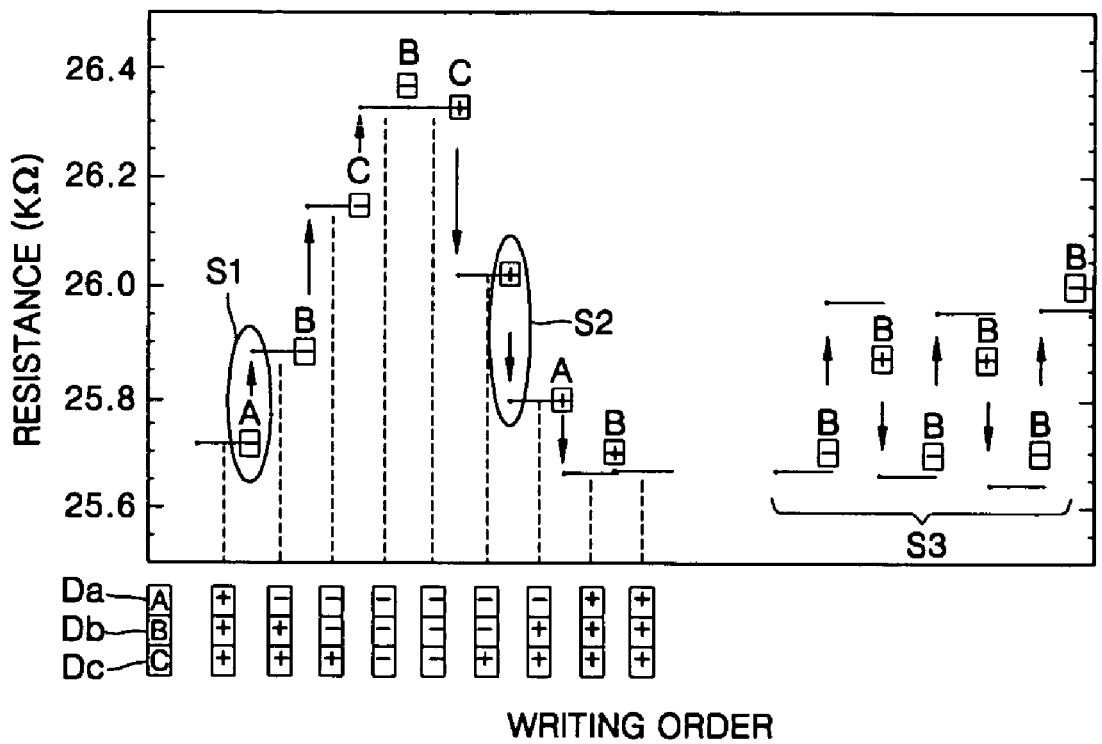
FIG. 11 is a graph illustrating changes in the resistance of a conductive oxide layer according to a direction of remanent polarization in domains of a ferroelectric layer.

FIG. 11 is a graph illustrating changes in resistance of a conductive oxide layer located under a ferroelectric layer according to a direction of remanent polarization of a domain of a ferroelectric layer.

Referring to FIG. 11, the reference symbols Da, Db, and Dc represent first, second, and third domains of the ferroelectric layer. The first, second and third domains are located close to one another. The reference symbols A, B, and C represent remanent polarizations of the first through third domains Da, Db, and Dc. Furthermore, "+" and "−" indicate the directions of the remanent polarizations A, B, and C. More specifically, "+" indicates that the remanent polarizations A, B, and C are arranged downward, "−" indicates that the remanent polarizations A, B, and C are arranged upward. For instance, as shown in a lower portion of FIG. 6, when the first through third domains Da, Db, and Dc are "+", the remanent polarizations of the first through third domains Da, Db, and Dc are all arranged downward.

Meanwhile, reference symbols S1 through S3 represent first through third shifts, respectively.

In the first shift S1, only the direction of the remanent polarization A of the first domain Da is shifted to "−" when the directions of the remanent polarizations A, B, and C of the first through third domains Da, Db, and Dc are all "+".

In the second shift S2, only the direction of the remanent polarization B of the second domain Db is shifted to "+" when the directions of the remanent polarizations A, B, and C of the first through third domains Da, Db, and Dc are "−", "−", and "+", respectively.

In the third shift S3, only the direction of the remanent polarization B of the second domain Db is shifted from "+" to "−" or vice versa when the directions of the remanent polarizations A and C of the first and third domains Da and Dc are fixed.

Referring to FIG. 11, when the direction of the remanent polarizations A, B, and C of the first through third domains Da, Db, and Dc are all "+" (hereinafter a third case), the resistance of a portion of a conductive oxide layer that contacts the first through third domains Da, Db, and Dc is minimized. When the remanent polarizations A, B, and C are all "−" (hereinafter a fourth case), the resistance of the portion of the conductive oxide layer is maximized. Furthermore, in the third case, when the direction of one of the remanent polarizations of the first through third domains Da, Db, and Dc is reversed, the resistance of the conductive oxide layer increases. On the contrary, in the fourth case, when the direction of one remanent polarization among the first through third domains Da, Db, and Dc is reversed, the resistance of the conductive oxide layer decreases.

In general, as the number of domains having "+" remanent polarizations increases, the resistance of the conductive oxide layer decreases, as the number of domains having "−" remanent polarizations increases, the resistance of the conductive oxide layer increases.

It is assumed that the equivalent recording medium is manufactured to be the same as the second recording medium. In this case, a gate voltage Vg of +25 V or −25 V may be applied to the semiconductor substrate 30. A case when a gate voltage Vg of +25 V is applied to the semiconductor substrate 30 is referred to as a fifth case, and a case when a gate voltage Vg of −25 V is applied to the semiconductor substrate 30 is referred to as a sixth case. The fifth and sixth cases are the same as the first and second cases, except for the quantity of electric charge induced at a contact surface of the second semiconductor layer 34 to which the insulating layer 32 is contacted.

In the fifth case, the second ferroelectric layer of the second recording medium is polarized toward a semiconductor layer that contacts a probe. Thus, in the fifth case, the energy level of the second semiconductor layer 34 of the equivalent recording medium varies in the same pattern as the energy level $E_C$ or $E_V$ of the first semiconductor layer 16 of FIG. 5.

In the sixth case, the second ferroelectric layer of the second recording medium is polarized toward a lower electrode. Thus, in the sixth case, the energy level of the second semiconductor layer 34 of the equivalent recording medium varies in the same pattern as the energy level $E_C'$ or $E_V'$ of the first semiconductor layer 16 of FIG. 6.

In order to measure the current-voltage characteristics between the second semiconductor layer 34 and the probe 20 of the equivalent recording medium in each of the fifth and sixth cases, a predetermined voltage V is applied to the second semiconductor layer 34 and to the probe 20 after a gate voltage Vg of +25 V or −25 V is applied to the semiconductor substrate 30.

Figure 12:
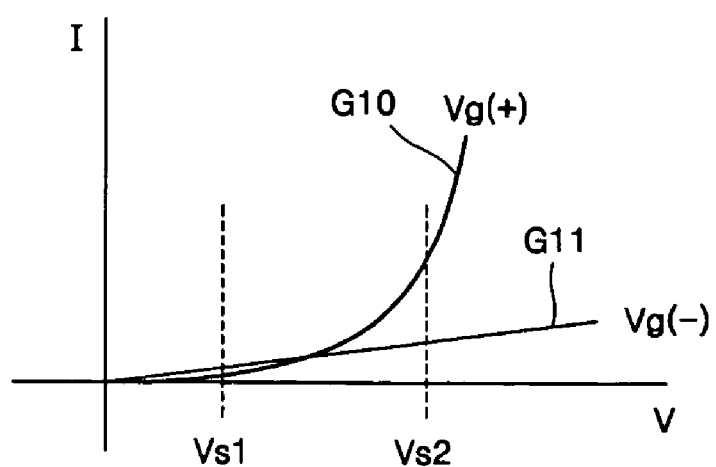
FIG. 12 is a graph illustrating the current-voltage characteristics in the case of an equivalent of the recording medium of FIG. 8 having a large polarization magnitude.

The results of measuring the voltage-current characteristics of the equivalent recording medium, i.e., the voltage-current characteristics (e.g., the resistance characteristics) between the second semiconductor layer 34 and the probe 20, are illustrated in FIG. 12.

Referring to FIG. 12, G10 is a tenth curve illustrating the current-voltage characteristics between the second semiconductor layer 34 and the probe 20 obtained when a positive gate voltage Vg is applied to the semiconductor substrate 30, and then the predetermined voltage V is applied between the second semiconductor layer 34 and the probe 20. G11 is an eleventh curve illustrating the current-voltage characteristics between the second semiconductor layer 34 and the probe 20 obtained when a negative gate voltage Vg is applied to the semiconductor substrate 30, and then the predetermined voltage V is applied between the second semiconductor layer 34 and the probe 20. Vg(+) denotes the positive gate voltage Vg, and Vg(−) denotes the negative gate voltage Vg.

Referring to the tenth and eleventh curves G10 and G11 of FIG. 12, in the fifth case, which is equivalent to the second ferroelectric layer polarized toward a barrier layer, as the sensing voltage applied between the second semiconductor layer 34 and the probe 20 of the equivalent recording medium is increased, current increases exponentially, as indicated by the tenth curve G10. On the other hand, in the sixth case, which is equivalent to the second ferroelectric layer polarized toward a lower electrode, the current increases in proportion to the sensing voltage, as indicated by the eleventh curve G11.

Therefore, as shown in FIG. 12, the resistance of the equivalent recording medium is measured at a first sensing voltage Vs1 and then at a second sensing voltage Vs2. The resistance of the equivalent recording medium measured at the first sensing voltage Vs1 is referred to as a first resistance RVs1, and the resistance of the equivalent recording medium measured at the sensing voltage Vs2 is referred to as a second resistance RVs2. In the fifth case, the first and second resistances RVs1 and RVs2 have different values. On the other hand, in the sixth case, the first and second resistances RVs1 and RVs2 have almost the same value.

As described above, since in both of the fifth and sixth cases, the resistances of the equivalent recording medium measured at different sensing voltages have different values, it is possible to recognize the polarization direction of the second ferroelectric layer of the equivalent recording medium by measuring the variation in resistance of the equivalent recording medium at different sensing voltages. The polarization direction of the second ferroelectric layer corresponds to data written on the equivalent recording medium. Therefore, it is possible to determine whether the data recorded on the equivalent recording medium is "1" or "0" by measuring the variation in resistance of the equivalent recording medium at different sensing voltages.

Figure 13:
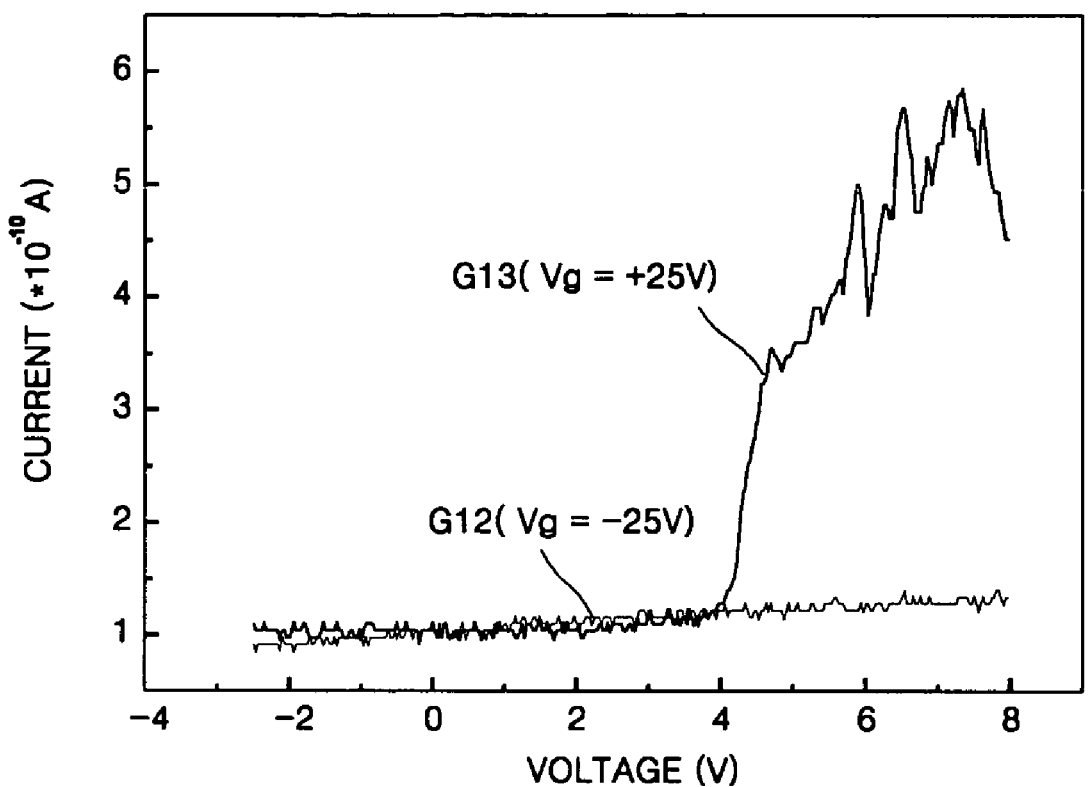
FIG. 13 is a graph illustrating results of measuring variations of current-voltage characteristics between the second semiconductor layer and the platinum probe with respect to the gate voltage Vg in a case where an equivalent to the recording medium of FIG. 8 comprises a ferroelectric layer having a large polarization magnitude.

FIG. 13 is a diagram illustrating results of measuring the current-voltage characteristics between the second semiconductor layer 34 and the probe 20.

In order to measure the current-voltage characteristics between the second semiconductor layer 34 and the probe 20, the current flowing between the second semiconductor layer 34 and the probe 20 was measured while gradually increasing the predetermined voltage V applied between the second semiconductor layer 34 and the probe 20 after applying a gate voltage Vg of +25 V or −25 V to the semiconductor substrate 30 of the equivalent recording medium.

Referring to FIG. 13, G12 is a twelfth curve illustrating results of measuring the current flowing between the second semiconductor layer 34 and the probe 20 while gradually increasing the predetermined voltage V applied therebetween after applying a gate voltage Vg of −25 V to the semiconductor substrate of the equivalent recording medium. G13 is a thirteenth curve illustrating results of measuring the current flowing between the second semiconductor layer 34 and the probe 20 while gradually increasing the predetermined voltage V applied therebetween after applying a gate voltage Vg of +25 V to the semiconductor substrate of the equivalent recording medium. The twelfth and thirteenth curves G12 and G13 correspond to the sixth and fifth cases, respectively.

Referring to the twelfth and thirteenth curves G12 and G13 of FIG. 13, the slopes of the twelfth and thirteenth curves G12 and G13 hardly vary until the predetermined voltage V applied between the second semiconductor layer 34 and the probe 20 reaches 4 V. However, once the predetermined voltage V applied between the second semiconductor layer 34 and the probe 20 exceeds 4 V, the slope of the thirteenth curve G13 dramatically increases. This is the same result as seen in FIG. 12.

As described above, the recording medium according to the preferred embodiments of the present invention includes a ferroelectric layer, where the data is stored, a semiconductor layer above the ferroelectric layer, a lower electrode below the ferroelectric layer, and a barrier layer disposed between the semiconductor layer and the ferroelectric layer. Accordingly, when writing the data to the ferroelectric layer or reading the data written in the ferroelectric layer, the probe and the ferroelectric layer are not in direct contact with one another. Thus, abrasion of the ferroelectric layer is prevented.

Furthermore, according to preferred embodiment of the present invention, the data written in the ferroelectric layer is easily read simply by applying a reading voltage between the semiconductor layer and the probe, and thus, the reading process is simplified in comparison with conventional methods. Therefore, the method of writing or reading data according to preferred embodiments of the present invention has an increased data reading speed while maintaining the ability to store data as it is.

In addition, no extra devices are necessary when writing and reading data, and thus, the memory device can be minimized.

While the preferred embodiments of the present invention are fully explained here, the present invention, it should not be construed as being limited to the embodiments set forth herein, rather these embodiments are provided so that this disclosure will be thorough and complete, and will fully convey the concept of the invention to those skilled in the art. For instance, those skilled in the art can recognize that a ferroelectric layer, a barrier layer, and a semiconductor layer may be further included under the lower electrode 10 and a probe to write data to the ferroelectric layer and to read the data may be further included under the lower electrode 10.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of reading data from a nonvolatile memory device comprising a recording medium which comprises a lower electrode, a ferroelectric layer to which the data is written, formed on the lower electrode, a barrier layer formed on the ferroelectric layer, and a semiconductor layer formed on the barrier layer and functioning as an upper electrode; and a probe which writes the data to the recording medium or reads the data from the recording medium while the probe is directly contacted to the semiconductor layer, wherein the barrier layer prevents a reaction between the ferroelectric layer and the semiconductor layer, the method comprising:

a first operation of applying a reading voltage between the probe and the semiconductor layer while contacting a surface of the semiconductor layer with the probe; and a second operation of measuring a state of remanent polarization in the ferroelectric layer by measuring electrical characteristics between the probe and the semiconductor layer;

wherein the semiconductor layer forms Schottky junction with a metallic material of the probe; and wherein the first operation comprises sequentially applying a first read voltage and then a second read voltage between the probe and the semiconductor layer, the first and second read voltages being different from each other.

2. The method as claimed in claim 1 wherein the ferroelectric layer comprises a PZT layer, an STO layer, a BTO layer, or a PTO layer.

3. The method as claimed in claim 1, wherein the barrier layer comprises a yttrium oxide ($Y_2O_3$) layer or an aluminum oxide ($Al_2O_3$) layer.

4. The method as claimed in claim 1 wherein the second operation comprises:

measuring a first current or a first resistance between the probe and the semiconductor layer based on the first read voltage;

measuring a second current or a first resistance between the probe and the semiconductor layer based on the second read voltage; and determining a state of remanent polarization of the ferroelectric layer by obtaining a difference between the first and second currents or between the first and second resistances.

5. The method as claimed in claim 1 wherein the probe is composed of a metallic material that forms a Schoffky junction together with the semiconductor layer.

* * * * *